US012813190B2

(12) United States Patent
Lee et al.

(10) Patent No.: US 12,813,190 B2
(45) Date of Patent: Nov. 24, 2026

(54) SUBSTRATE TREATMENT APPARATUS AND METHOD THEREOF

(71) Applicant: SEMES CO., LTD., Chungcheongnam-do (KR)

(72) Inventors: Kyeong Min Lee, Gyeonggi-do (KR); Tae Keun Kim, Gyeonggi-do (KR); Kang Sul Kim, Gyeonggi-do (KR); Min Hee Cho, Gyeonggi-do (KR); Won Young Kang, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 65 days.

(21) Appl. No.: 17/879,785

(22) Filed: Aug. 3, 2022

(65) Prior Publication Data

US 2023/0170229 A1 Jun. 1, 2023

(30) Foreign Application Priority Data

Nov. 30, 2021 (KR) ........................ 10-2021-0168885

(51) Int. Cl.
*H10P 70/00* (2026.01)
*H10P 72/00* (2026.01)

(52) U.S. Cl.
CPC .......... *H10P 72/0414* (2026.01); *H10P 70/20* (2026.01); *H10P 72/0411* (2026.01)

(58) Field of Classification Search
None
See application file for complete search history.

(56) References Cited

U.S. PATENT DOCUMENTS 10,272,478 B2 4/2019 Aibara et al.
10,792,711 B2 10/2020 Aibara et al.
11,925,963 B2 * 3/2024 Lee ........................ B08B 7/0014
(Continued)

FOREIGN PATENT DOCUMENTS

CN 102543685 7/2012
CN 105321855 2/2016
(Continued)

OTHER PUBLICATIONS

Merriam-Webster dictionary definition of "surface".*
(Continued)

*Primary Examiner* — Kaj K Olsen
*Assistant Examiner* — Ryan L Coleman
(74) *Attorney, Agent, or Firm* — WOMBLE BOND DICKINSON (US) LLP

(57) ABSTRACT

Provided are a substrate treatment apparatus and method for treating a substrate by simultaneously providing a stripper for peeling a coating film on the substrate to an entire surface of the substrate. The substrate treatment method includes discharging a first liquid onto a substrate by using a first nozzle, and forming a coating film collecting particles by using the first liquid; spraying a second liquid on the substrate by using a second nozzle, and peeling the coating film from the substrate by using the second liquid; and discharging a third liquid onto the substrate by using a third nozzle, and rinsing the coating film from the substrate by using the third liquid, wherein in the peeling of the coating film, the second liquid is simultaneously sprayed on an entire surface of the substrate.

19 Claims, 10 Drawing Sheets

(56) References Cited

U.S. PATENT DOCUMENTS

| | | | | |
|---|---|---|---|---|
| 2004/0206452 | A1* | 10/2004 | Okuda | B08B 3/02 156/345.11 |
| 2006/0260661 | A1* | 11/2006 | Verhaverbeke | H01L 21/02041 134/198 |
| 2007/0169793 | A1* | 7/2007 | Shimada | H01L 21/67051 134/26 |
| 2012/0162618 | A1* | 6/2012 | Tokumaru | G03F 7/3021 355/27 |
| 2012/0260947 | A1* | 10/2012 | Kaneko | B08B 3/10 134/105 |
| 2016/0035561 | A1* | 2/2016 | Aibara | B08B 3/08 134/4 |
| 2017/0236703 | A1* | 8/2017 | Higuchi | B05B 12/1418 134/18 |
| 2018/0247835 | A1* | 8/2018 | Lee | H01L 21/02057 |

FOREIGN PATENT DOCUMENTS

| | | | |
|---|---|---|---|
| JP | 2010056318 | * | 3/2010 |
| JP | 2012-142396 | | 7/2012 |
| KR | 10-0276620 | | 4/2001 |
| KR | 10-2007-0078373 | | 7/2007 |
| KR | 10-2014-0003888 | | 1/2014 |
| KR | 10-2016-0016667 | | 2/2016 |
| KR | 10-2020-0056045 | | 5/2020 |
| KR | 10-2262820 | | 6/2021 |

OTHER PUBLICATIONS

Merriam-Webster dictionary definition of “part”.*

Translation of JP2010056318 by Shiga, published Mar. 11, 2010.*

Office Action dated Jun. 9, 2025 for Korean Patent Application No. 10-2021-0168885 and its English translation from Global Dossier.

Office Action dated Feb. 25, 2026 for Korean Patent Application No. 10-2021-0168885 and its English translation by Global Dossier.

Office Action (1st) dated Jan. 7, 2026 for Chinese Patent Application No. 202210944623.9 and its English translation from Global Dossier.

* cited by examiner

SUBSTRATE TREATMENT APPARATUS AND METHOD THEREOF

CROSS-REFERENCE TO RELATED APPLICATION

This application claims priority from Korean Patent Application No. 10-2021-0168885 filed on Nov. 30, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to an apparatus and a method for treating a substrate, and more particularly, to an apparatus and a method for cleaning a substrate.

2. Description of the Related Art

A semiconductor element manufacturing process may be continuously performed in a semiconductor element manufacturing facility, and may be divided into a pre-process and a post-process. The semiconductor element manufacturing facility may be installed in a space defined as a FAB to manufacture a semiconductor element.

The pre-process refers to a process of forming a circuit pattern on a wafer to complete a chip. The pre-process may include a deposition process of forming a thin film on the wafer, a photolithography process of transferring a photoresist onto the thin film using a photo mask, an etching process of selectively rinsing unnecessary portions using chemicals or reactive gases to form a desired circuit pattern on the wafer, an ashing process of rinsing the photoresist remaining after etching, an ion implantation process of implanting ions into a portion connected to the circuit pattern to have the characteristics of an electronic element, and a cleaning process of rinsing contaminants from the wafer.

The post-process refers to a process of evaluating a performance of a product that has been completed through the pre-process. The post-process may include a first inspection process of checking whether each chip on the wafer operates to select good and defective products, a package process of cutting and separating each chip through dicing, die bonding, wire bonding, molding, marking, and the like to form a product shape, and a final inspection process of finally inspecting characteristics and reliability of the product through electrical characteristic inspection, burn-in inspection, and the like.

SUMMARY

In the case of the cleaning process, the particles remaining on the substrate may be rinsed by forming a coating film capable of collecting particles on the wafer and then peeling and rinsing the coating film.

However, conventionally, there is a problem in that wetting uniformity of the substrate is low because a stripper is provided to a central portion of the substrate. In addition, due to this problem, there is also a problem in that a degree of peeling is different for each area of the substrate, and a portion of the coating film still remains on the substrate even after the cleaning process is finished.

Aspects of the present disclosure provide a substrate treatment apparatus and method for treating a substrate by simultaneously providing a stripper for peeling a coating film on the substrate to an entire surface of the substrate.

Aspects of the present disclosure are not limited to the aspects mentioned above, and other aspects not mentioned will be clearly understood by those skilled in the art from the following description.

According to one aspect of the present disclosure, there is provided a substrate treatment method including: discharging a first liquid onto a substrate by using a first nozzle, and forming a coating film collecting particles by using the first liquid; spraying a second liquid on the substrate by using a second nozzle, and peeling the coating film from the substrate by using the second liquid; and discharging a third liquid onto the substrate by using a third nozzle, and rinsing the coating film from the substrate by using the third liquid, wherein in the peeling of the coating film, the second liquid is simultaneously sprayed on an entire surface of the substrate.

In the peeling of the coating film, the second liquid may be sprayed in the form of an aerosol.

In the peeling of the coating film, the second liquid may be sprayed using compressed air.

The second liquid may have a direction of movement changed by the compressed air.

The second liquid may be de-ionized water (DIW).

The second nozzle may be height-adjusted according to a size of the substrate.

The second nozzle may spray the second liquid onto the substrate while rotating.

The second nozzle may be tilted with respect to a direction perpendicular to a length direction of the substrate.

The first liquid may be a liquid in which a polymer and a volatile component are mixed.

The third liquid may include iso-propyl alcohol (IPA).

According to another aspect of the present disclosure, there is provided a substrate treatment method including: discharging a first liquid onto a substrate using a first nozzle, and forming a coating film collecting particles by using the first liquid; spraying a second liquid on the substrate by using a second nozzle, and peeling the coating film from the substrate by using the second liquid; and discharging a third liquid onto the substrate by using a third nozzle, and rinsing the coating film from the substrate by using the third liquid, wherein in the peeling of the coating film, a direction of movement of the second liquid is changed by using compressed air, and the second liquid is simultaneously sprayed on an entire surface of the substrate in the form of an aerosol.

According to still another aspect of the present disclosure, there is provided a substrate treatment apparatus including: a substrate supporting module including a spin head having a top surface on which a substrate is seated, and rotating the substrate by operating the spin head; a treatment liquid recovery module provided on a side surface of the substrate supporting module and recovering a substrate treatment liquid deviated from the substrate when the substrate is rotated; and a spray module including a first nozzle, a second nozzle, and a third nozzle disposed on the substrate, sequentially providing liquids for treating the substrate, forming a coating film collecting particles by providing a first liquid on the substrate using the first nozzle, peeling the coating film from the substrate by providing a second liquid on the substrate using the second nozzle, and rinsing the coating film from the substrate by providing a third liquid on the substrate using the third nozzle, wherein the second nozzle simultaneously sprays the second liquid on an entire surface of the substrate.

The second nozzle may include: a body portion having a space formed therein; a first supply port penetrating through a first side surface of the body portion to be connected to the space, and providing the second liquid to the space; a second supply port penetrating through a second side surface of the body portion to be connected to the space, and providing compressed air to the space; and a spray port penetrating through a third side surface of the body portion to be connected to the space, and spraying the second liquid onto the substrate, and may spray the second liquid onto the substrate by changing a direction of the second liquid using the compressed air.

A length direction of the first supply port may be different from a length direction of the second supply port and a length direction of the spray port.

The length direction of the first supply port may be perpendicular to the length direction of the second supply port and the length direction of the spray port.

The second nozzle may spray the second liquid in the form of an aerosol.

The second nozzle may spray the second liquid in the form of an aerosol using compressed air.

The details of other exemplary embodiments are included in the detailed description and drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
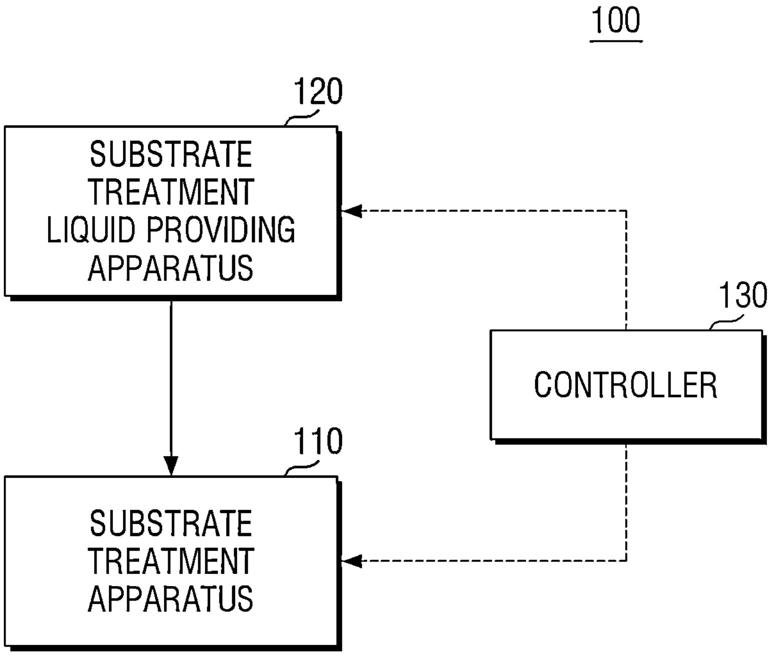
FIG. 1 is a diagram schematically illustrating an internal configuration of a semiconductor process system including a substrate treatment apparatus according to an exemplary embodiment of the present disclosure.

Hereinafter, exemplary embodiments of the present disclosure will be described in detail with reference to the accompanying drawings. Advantages and features of the present disclosure, and a method for achieving the advantages and features will become apparent with reference to the exemplary embodiments described below in detail in conjunction with the accompanying drawings. However, the present disclosure is not limited to the exemplary embodiments disclosed below, but may be implemented in a variety of different forms, these exemplary embodiments will be provided only in order to make the present disclosure complete and allow those skilled in the art to completely recognize the scope of the present disclosure, and the present disclosure is only defined by the scope of the claims. Throughout the specification, the same components will be denoted by the same reference numerals.

A phrase "one element or layer 'on' another element or layer" includes both of a case where one element or layer is directly on another element or layer and a case where one element or layer is on another element or layer with the other layer or element interposed therebetween. On the other hand, a phase "one element or layer 'directly on' another element or layer" indicates that one element or layer is on another element or layer without the other layer or element interposed therebetween.

Spatially relative terms "below", "beneath", "lower", "above", "upper", and the like, may be used to easily describe correlations between one element or components and another element or components as illustrated in the drawings. The spatially relative terms are to be understood as terms including different directions of the elements at the time of use or operation in addition to directions illustrated in the drawings. For example, when an element illustrated in the drawing is turned over, an element described as being 'below or beneath' another element may be located 'above' another element. Therefore, an exemplary term 'below' may include both of directions of below and above. The element may also be oriented in other orientations, and thus spatially relative terms may be interpreted according to the orientation.

Terms "first", "second" and the like are used to describe various elements, components, and/or sections but these elements, components, and/or sections are not limited by these terms. These terms are used only in order to distinguish one element, component, or section from another element, component or section. Accordingly, a first element, a first component, or a first section mentioned below may also be a second element, a second component, or a second section within the concept of the present disclosure.

The terms used herein are for the purpose of describing the exemplary embodiments and are not intended to limit the present disclosure. In the present specification, a singular form includes a plural form unless explicitly stated otherwise. Components, steps, operations, and/or elements mentioned by the terms "comprise" and/or "comprising" used in the present disclosure do not exclude the existence or addition of one or more other components, steps, operations, and/or elements.

Unless defined otherwise, all terms (including technical and scientific terms) used in the present specification have the same meaning as meanings commonly understood by those skilled in the art to which the present disclosure pertains. In addition, terms defined in generally used dictionaries are not ideally or excessively interpreted unless specifically defined clearly.

Hereinafter, exemplary embodiments of the present disclosure will be described in detail with reference to the accompanying drawings. In describing the exemplary embodiments of the present disclosure with reference to the accompanying drawings, components that are the same as or correspond to each other will be denoted by the same reference numerals, and an overlapping description thereof will be omitted.

The present disclosure relates to a substrate treatment apparatus and method for peeling and rinsing a coating film collecting particles from a substrate by simultaneously providing a stripper to an entire surface of the substrate when cleaning the substrate (e.g., a wafer). According to the present disclosure, it is possible to improve wetting uniformity of the substrate, and it becomes possible to completely rinse the coating film on the substrate. Hereinafter, the present disclosure will be described in detail with reference to drawings and the like.

FIG. 1 is a diagram schematically illustrating an internal configuration of a semiconductor process system including a substrate treatment apparatus according to an exemplary embodiment of the present disclosure.

Referring to FIG. 1, a semiconductor process system 100 may include a substrate treatment apparatus 110, a substrate treatment liquid providing apparatus 120, and a controller 130.

The substrate treatment apparatus 110 is an apparatus for treating a substrate using a chemical. The substrate treatment apparatus 110 may be provided as a cleaning process chamber for cleaning the substrate using the chemical.

The chemical may be a liquid substance (e.g., an organic solvent) or a gaseous substance. The chemical may include substances that have strong volatility and generate a lot of fumes or have high residual property due to high viscosity. The chemical may be selected from, for example, a substance containing an iso-propyl alcohol (IPA) component, a substance containing a sulfuric acid component (e.g., SPM containing a sulfuric acid component and a hydrogen peroxide component), a substance containing an aqueous ammonia component (e.g., SC-1($H_2O_2$+$NH_4OH$), a substance containing a hydrofluoric acid component (e.g., diluted hydrogen fluoride (DHF)), and a substance containing a phosphoric acid component. Hereinafter, these chemical liquids used to treat the substrate will be defined as a substrate treatment liquid.

The substrate treatment liquid providing apparatus 120 is an apparatus that provides a substrate treatment liquid to the substrate treatment apparatus 110. The substrate treatment liquid providing apparatus 120 may be connected to a spray module of the substrate treatment apparatus 110 for this purpose. A more detailed description of an internal configuration of the substrate treatment apparatus 110 will be described later with reference to the drawings.

The controller 130 is an apparatus that controls an operation of the substrate treatment apparatus 110. In this case, the controller 130 may control, for example, operations of a rotation driving portion 213 of a substrate supporting module 210, a first driving portion 233 of an elevating module 230, and a second driving portion 244 of a spray module 240, which will be described later with reference to FIG. 2.

The controller 130 may be provided as a computer or a server, including a process controller, a control program, an input module, an output module (or a display module), a memory module, and the like. In the above, the process controller may include a microprocessor that executes a control function for each component constituting the substrate treatment apparatus 110, and the control program may execute a variety of treatments of the substrate treatment apparatus 110 under the control of the process controller. The memory module may store a program for executing a variety of treatments of the substrate treatment apparatus 110 according to various data and treatment conditions, that is, a treatment recipe.

Meanwhile, the controller 130 may also control an operation of the substrate treatment liquid providing apparatus 120 so that the substrate treatment liquid may be supplied from the substrate treatment liquid providing apparatus 120 to the substrate treatment apparatus 110 if necessary.

Next, the substrate treatment apparatus 110 will be described. As described above, the substrate treatment apparatus 110 may be provided as a cleaning process chamber for cleaning the substrate using the chemical.

Figure 2:
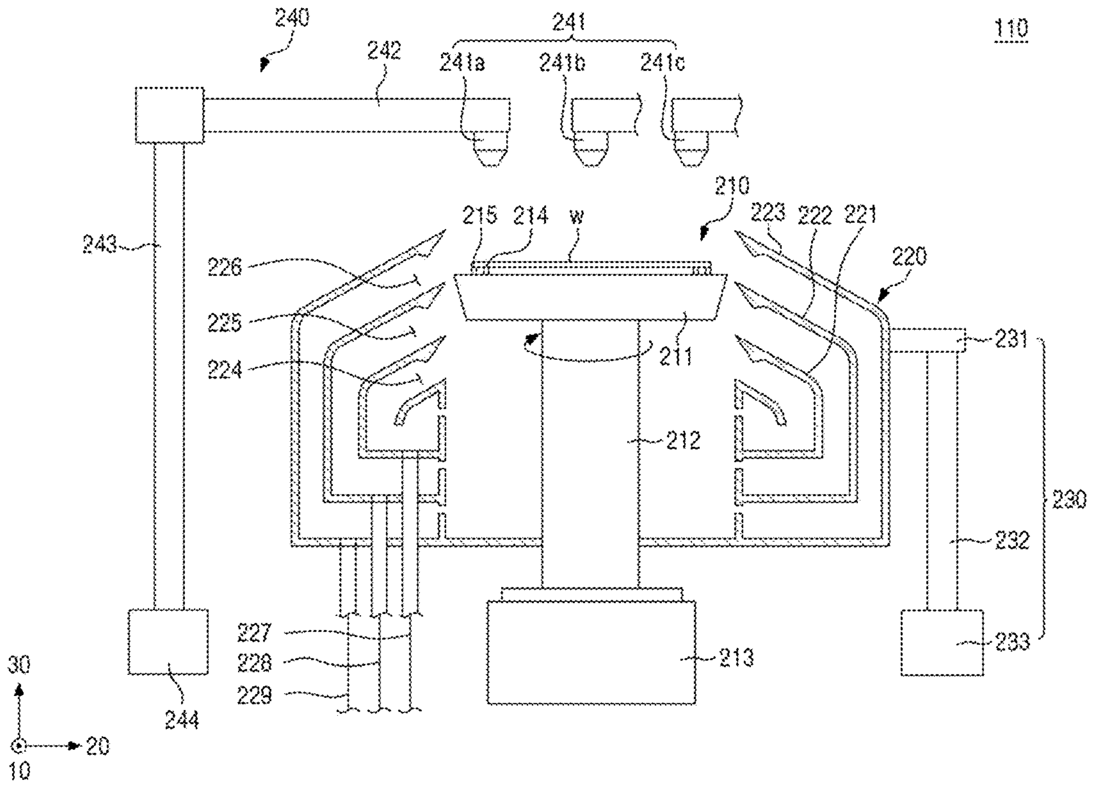
FIG. 2 is a diagram specifically illustrating an internal structure of a substrate treatment apparatus according to an exemplary embodiment of the present disclosure.

FIG. 2 is a diagram specifically illustrating an internal structure of a substrate treatment apparatus according to an exemplary embodiment of the present disclosure.

Referring to FIG. 2, the substrate treatment apparatus 110 may include a substrate supporting module 210, a treatment liquid recovery module 220, an elevating module 230, and a spray module 240.

The substrate supporting module 210 supports a substrate W. The substrate supporting module 210 may rotate the substrate W in directions (a first direction 10 and a second direction 20) perpendicular to a third direction 30 when treating the substrate W. The substrate supporting module 210 may be disposed inside the treatment liquid recovery module 220 to recover the substrate treatment liquid used in treating the substrate W.

The substrate supporting module 210 may include a spin head 211, a rotation shaft 212, a rotation driving portion 213, a support pin 214, and a guide pin 215.

The spin head 211 rotates along a rotation direction of the rotation shaft 212 (a vertical direction to the third direction 30). The spin head 211 may be provided to have the same shape as that of the substrate W. However, the present exemplary embodiment is not limited thereto. The spin head 211 may also be provided to have a shape different from that of the substrate W.

The rotation shaft 212 generates a rotational force using energy provided from the rotation driving portion 213. The rotation shaft 212 may be coupled to the rotation driving portion 213 and the spin head 211, respectively, to transmit the rotational force generated by the rotation driving portion 213 to the spin head 211. The spin head 211 rotates along the rotation shaft 212, and in this case, the substrate W seated on the spin head 211 may also rotate together with the spin head 211.

The support pin 214 and the guide pin 215 fix a position of the substrate W on the spin head 211. For this purpose, on the spin head 211, the support pin 214 supports a bottom surface of the substrate W, and the guide pin 215 supports a side surface of the substrate W. A plurality of support pins 214 and guide pins 215 may be respectively installed on the spin head 211.

The support pin 214 may be disposed to have an annular ring shape as a whole. Accordingly, the support pin 214 may support the bottom surface of the substrate W so that the substrate W may be spaced apart from an upper portion of the spin head 211 by a predetermined distance.

The guide pin 215, which is a chucking pin, may support the substrate W so that the substrate W does not deviate from its original position when the spin head 211 rotates.

Meanwhile, a back nozzle (not illustrated) may also be installed on the upper portion of the spin head 211. The back nozzle is for cleaning the bottom surface of the substrate W. The back nozzle may be installed in an upper center of the spin head 211 and may spray the substrate treatment liquid to the bottom surface of the substrate W.

The treatment liquid recovery module 220 recovers the substrate treatment liquid used to treat the substrate W. The treatment liquid recovery module 220 may be installed to surround the substrate supporting module 210, and thus may provide a space in which a treatment process for the substrate W is performed.

After the substrate W is seated and fixed on the substrate supporting module 210, when the substrate W starts to rotate by the substrate supporting module 210, the spray module 240 may spray the substrate treatment liquid on the substrate W under the control of the controller 130. Then, the substrate treatment liquid discharged onto the substrate W due to a centrifugal force generated by the rotational force of the substrate supporting module 210 may be dispersed in a direction in which the treatment liquid recovery module 220 is positioned. In this case, the treatment liquid recovery module 220 may recover the substrate treatment liquid when the substrate treatment liquid flows into the inside thereof through an inlet (that is, a first opening 224 of a first collection container 221, a second opening 225 of a second collection container 222, and a third opening 226 of a third collection container 223 which will be described later).

The treatment liquid recovery module 220 may include a plurality of collection containers. The treatment liquid recovery module 220 may include, for example, three collection containers. When the treatment liquid recovery module 220 includes the plurality of collection containers as described above, the substrate treatment liquid used in the substrate treatment process may be separated and recovered using the plurality of collection containers, and thus the substrate treatment liquid may be recycled.

When the treatment liquid recovery module 220 includes the three collection containers, the treatment liquid recovery module 220 may include a first collection container 221, a second collection container 222, and a third collection container 223. The first collection container 221, the second collection container 222, and the third collection container 223 may be implemented as, for example, bowls.

The first collection container 221, the second collection container 222, and the third collection container 223 may recover different substrate treatment liquids. For example, the first collection container 221 may recover water, the second collection container 222 may recover a first chemical (e.g., any one of a substance containing an IPA component and a substance containing an SPM component), and the third collection container 223 may recover a second chemical (e.g., the other one of a substance containing an IPA component and a substance containing an SPM component).

The first collection container 221, the second collection container 222, and the third collection container 223 may be connected to recovery lines 227, 228, and 229 extending in a downward direction (the third direction 30) from the bottom surfaces thereof. A first treatment liquid, a second treatment liquid, and a third treatment liquid recovered through the first collection container 221, the second collection container 222, and the third collection container 223 may be treated to be reused through a treatment liquid regeneration system (not illustrated).

The first collection container 221, the second collection container 222, and the third collection container 223 may be provided in an annular ring shape surrounding the substrate supporting module 210. The sizes of the first collection container 221, the second collection container 222, and the third collection container 223 may increase from the first collection container 221 to the third collection container 223 (that is, in the second direction 20). When an interval between the first collection container 221 and the second collection container 222 is defined as a first interval, and an interval between the second collection container 222 and the third collection container 223 is defined as a second interval, the first interval may be the same as the second interval. However, the present exemplary embodiment is not limited thereto. It is also possible that the first interval is different from the second interval. That is, the first interval may be greater than the second interval, and may be smaller than the second interval.

The elevating module 230 linearly moves the treatment liquid recovery module 220 in the vertical direction (the third direction 30). The elevating module 230 may serve to adjust a relative height of the treatment liquid recovery module 220 with respect to the substrate supporting module 210 (or the substrate W) through such a linear movement.

The elevating module 230 may include a bracket 231, a first supporting shaft 232, and a first driving portion 233.

The bracket 231 is fixed to an outer wall of the treatment liquid recovery module 220. The bracket 231 may be coupled to the first supporting shaft 232 that is moved in the vertical direction by the first driving portion 233.

When the substrate W is seated on the substrate supporting module 210, the substrate supporting module 210 may be positioned above the treatment liquid recovery module 220. Similarly, even when the substrate W is detached from the substrate supporting module 210, the substrate supporting module 210 may be positioned above the treatment liquid recovery module 220. In this case, the elevating module 230 may serve to lower the treatment liquid recovery module 220.

When the treatment process for the substrate W is performed, the substrate treatment liquid may be recovered into any one of the first collection container 221, the second collection container 222, and the third collection container 223 depending on the type of the substrate treatment liquid discharged onto the substrate W. Even in this case, the elevating module 230 may serve to elevate the treatment liquid recovery module 220 to a corresponding position. For example, when the first treatment liquid is used as the substrate treatment liquid, the elevating module 230 may elevate the treatment liquid recovery module 220 so that the substrate W is positioned at a height corresponding to the first opening 224 of the first collection container 221.

Meanwhile, in the present exemplary embodiment, the elevating module 230 may also adjust a relative height of the treatment liquid recovery module 220 with respect to the substrate supporting module 210 (or the substrate W) by linearly moving the substrate supporting module 210 in the vertical direction.

However, the present exemplary embodiment is not limited thereto. The elevating module 230 may also adjust the relative height of the treatment liquid recovery module 220 with respect to the substrate supporting module 210 (or the substrate W) by linearly moving the substrate supporting module 210 and the treatment liquid recovery module 220 in the vertical direction at the same time.

The spray module 240 is to provide a liquid used to treat the substrate W on the substrate W. The spray module 240 may include a nozzle 241, a nozzle supporting portion 242, a second supporting shaft 243, and a second driving portion 244.

The nozzle 241 is installed at an end portion of the nozzle supporting portion 242. The nozzle 241 may be moved to a process position or a standby position by the second driving portion 244.

In the above, the process position refers to an upper region of the substrate W, and the standby position refers to a remaining region except for the process position. The nozzle 241 may be moved to the process position when discharging the substrate treatment liquid onto the substrate W, and may deviate from the process position and move to the standby position after discharging the substrate treatment liquid onto the substrate W.

The spray module 240 may include a plurality of nozzles 241. In this case, the plurality of nozzles 241 may provide different liquids on the substrate W. For example, the spray module 240 may include three nozzles 241*a*, 241*b*, and 241*c*. In this case, a first nozzle 241*a* may discharge a treatment liquid onto the substrate W, and a second nozzle 241*b* may discharge a stripper onto the substrate W. In addition, the third nozzle 241*c* may discharge a removal liquid onto the substrate W.

Figure 3:
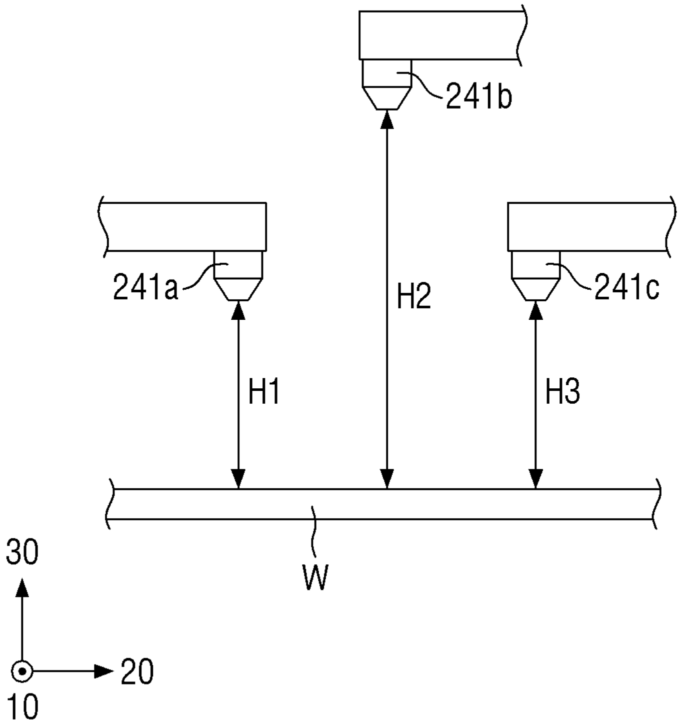
FIG. 3 is a first exemplary diagram for describing a plurality of nozzles of a spray module constituting the substrate treatment apparatus according to an exemplary embodiment of the present disclosure.

When the three nozzles 241*a*, 241*b*, 241*c* are positioned on the substrate W to provide the liquids, some nozzles may be disposed at the same height, and some nozzles may be disposed at different heights. For example, as illustrated in FIG. 3, the second nozzle 241*b* may be disposed at a relatively high position, and the first nozzle 241*a* and the third nozzle 241*c* may be disposed at a lower position than the second nozzle 241*b* (H2>H1=H3). FIG. 3 is a first exemplary diagram for describing a plurality of nozzles of a spray module constituting the substrate treatment apparatus according to an exemplary embodiment of the present disclosure.

However, the present exemplary embodiment is not limited thereto. All of the three nozzles 241*a*, 241*b*, and 241*c* may be disposed at different heights, and may also be disposed at the same height.

Figure 4:
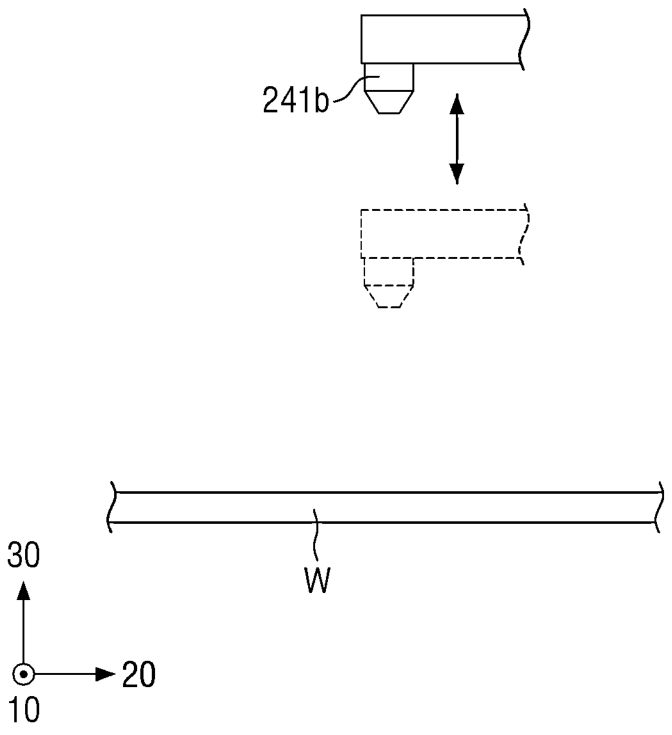
FIG. 4 is a second exemplary diagram for describing a plurality of nozzles of a spray module constituting the substrate treatment apparatus according to an exemplary embodiment of the present disclosure.

Meanwhile, the three nozzles 241*a*, 241*b*, and 241*c* may be height-adjusted on the substrate W. In the present exemplary embodiment, only some of the three nozzles 241*a*, 241*b*, and 241*c* may be provided to be height-adjustable. For example, as illustrated in FIG. 4, the second nozzle 241*b* may be provided to be height-adjustable. FIG. 4 is a second exemplary diagram for describing a plurality of nozzles of a spray module constituting the substrate treatment apparatus according to an exemplary embodiment of the present disclosure.

The description will be provided again with reference to FIG. 2.

The nozzle supporting portion 242 supports the nozzle 241. The nozzle supporting portion 242 may be formed to extend in a direction corresponding to a length direction of the spin head 211. That is, the length direction of the nozzle supporting portion 242 may be provided along the second direction 20.

The nozzle supporting portion 242 may be coupled to the second supporting shaft 243 extending in a direction perpendicular to the length direction of the nozzle supporting portion 242. The second supporting shaft 243 may be formed to extend in a direction corresponding to a height direction of the spin head 211. That is, a length direction of the second supporting shaft 243 may be provided along the third direction 30.

The second driving portion 244 rotates and elevates the second supporting shaft 243 and the nozzle supporting portion 242 interlocking with the second supporting shaft 243. According to such a function of the second driving portion 244, the nozzle 241 may be moved to the process position or the standby position.

Figure 5:
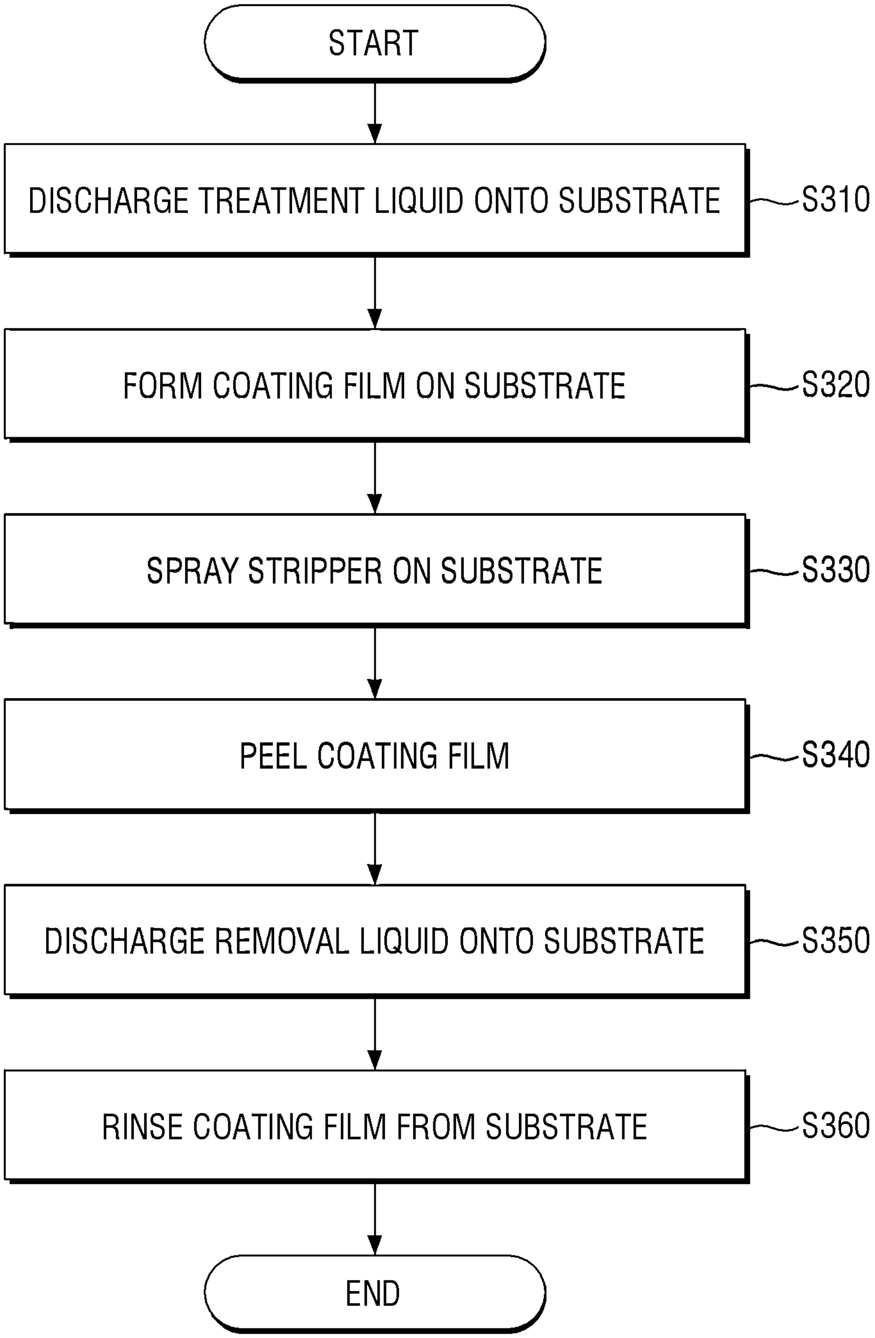
FIG. 5 is a flowchart sequentially illustrating a substrate treatment method of a substrate treatment apparatus according to an exemplary embodiment of the present disclosure.

Next, a method of treating the substrate W using the substrate treatment apparatus 110 will be described. FIG. 5 is a flowchart sequentially illustrating a substrate treatment method of a substrate treatment apparatus according to an exemplary embodiment of the present disclosure. Hereinafter, the description is made with reference to FIGS. 2 and 5.

First, a treatment liquid is discharged onto the substrate W using the first nozzle 241*a* of the spray module 240 (S310). In this case, the substrate W may be rotated according to an operation of the spin head 211. That is, the treatment liquid may be discharged onto the substrate W while the substrate W is rotating.

However, the present exemplary embodiment is not limited thereto. When the treatment liquid discharged onto the substrate W is diffused and distributed over the entire surface of the substrate W, the substrate W may start to rotate according to the operation of the spin head 211.

In the above, the treatment liquid may be prepared as a polymer solution including a polymer and a solvent. The polymer may include, for example, a resin component such as an acrylic resin or a phenol resin. The solvent is a solution having a volatile component and serves to dissolve the polymer.

Figure 6:
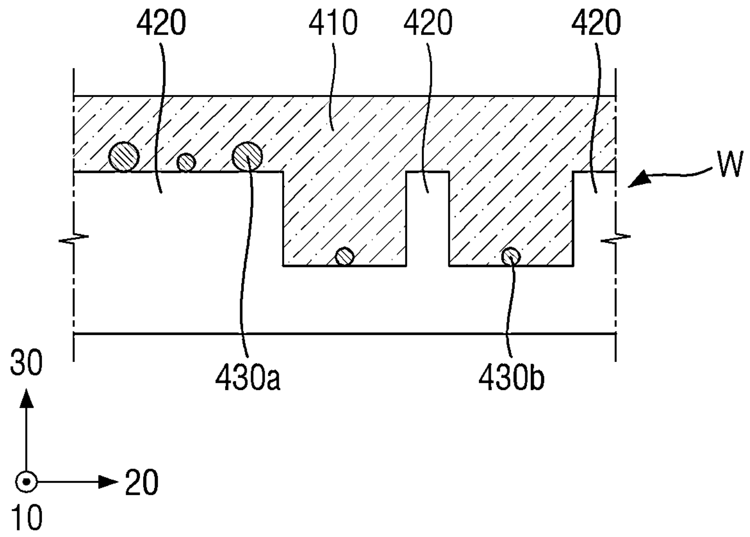
FIG. 6 is a first exemplary diagram for further describing each step of the substrate treatment method of FIG. 5.

When the first nozzle 241*a* discharges the treatment liquid onto the substrate W, the treatment liquid spreads in all directions from a central region on the substrate W and is applied to the entire surface of the substrate W. In this case, as illustrated in FIG. 6, the treatment liquid 410 may cover particles 430*a* remaining on the substrate W or particles 430*b* remaining between patterns 420. FIG. 6 is a first exemplary diagram for further describing each step of the substrate treatment method of FIG. 5.

Figure 7:
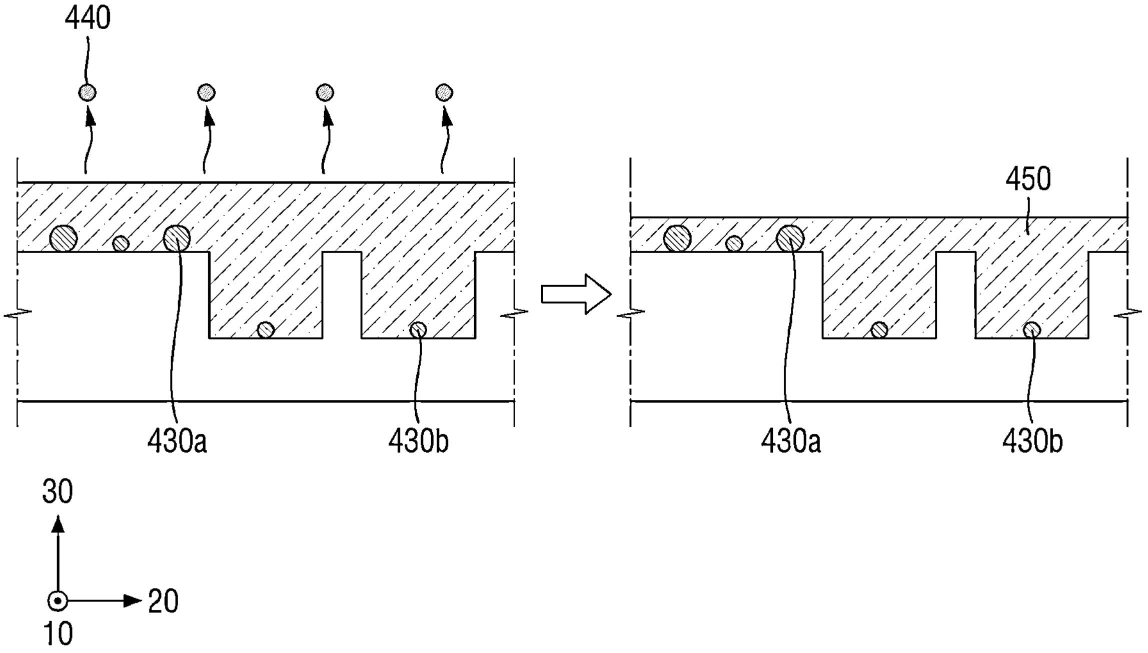
FIG. 7 is a second exemplary diagram for further describing each step of the substrate treatment method of FIG. 5.

As described above, the treatment liquid 410 includes the solvent 440 having the volatile component. Therefore, when the solvent 440 is volatilized, the treatment liquid 410 causes volumetric shrinkage as illustrated in FIG. 7 and is solidified on the substrate W. Accordingly, a coating film 450 collecting the particles 430*a* and 430*b* may be formed on the substrate W (S320). FIG. 7 is a second exemplary diagram for further describing each step of the substrate treatment method of FIG. 5.

The solvent 440 in the treatment liquid 410 may be volatilized by the spin head 211 spinning the substrate W. Alternatively, it is also possible to promote the volatilization of the solvent 440 by installing a heater in the substrate treatment apparatus 110 and heating the treatment liquid 410 using the heater. The heater may be installed in the spin head 211 in the form of a hot wire, for example.

Alternatively, it is also possible to promote the volatilization of the solvent 440 by heating the treatment liquid 410 using a light source disposed on the substrate W. The light source may be, for example, a lamp.

Alternatively, it is also possible to supply a high-temperature gas into the substrate treatment apparatus 110 and heat the treatment liquid 410 by using the high-temperature gas. On the other hand, since the solvent 440 may be naturally volatilized over time, it is also possible to wait until the treatment liquid 410 is solidified to form the coating film 450 after discharging the treatment liquid 410 onto the substrate W in the present exemplary embodiment.

The description will be provided again with reference to FIG. 5.

When the treatment liquid 410 is solidified to form the coating film 450 on the substrate W (S320), a stripper is sprayed on the substrate W using the second nozzle 241*b* of the spray module 240 (S330). In this case, the second nozzle 241*b* may be provided as a two-fluid spray nozzle so that the stripper may reach the entire surface of the substrate W at the same time.

Figure 8:
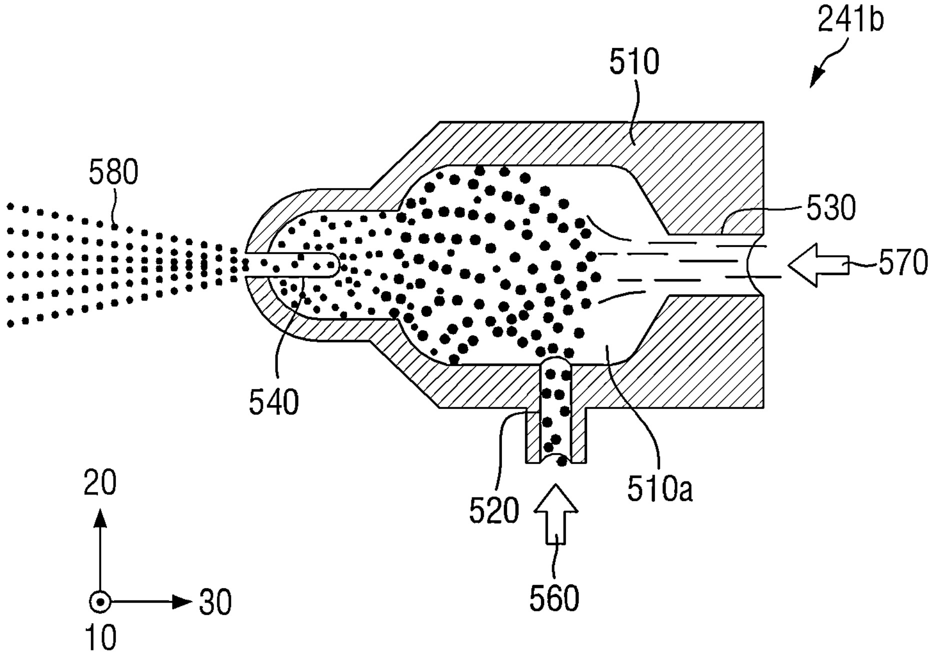
FIG. 8 is a diagram schematically illustrating an internal structure of a second nozzle of a spray module constituting the substrate treatment apparatus according to an exemplary embodiment of the present disclosure.

When the second nozzle 241*b* is provided as the two-fluid spray nozzle, the second nozzle 241*b* may have a structure as illustrated in FIG. 8, for example. FIG. 8 is a diagram schematically illustrating an internal structure of a second nozzle of a spray module constituting the substrate treatment apparatus according to an exemplary embodiment of the present disclosure.

Referring to FIG. 8, the second nozzle 241*b* may include a body portion 510, a first supply port 520, a second supply port 530, and a spray port 540.

The first supply port 520 provides a stripper 560 to an internal space 510*a* of the body portion 510. The first supply port 520 may penetrate through one surface of the body portion 510 to be connected to the internal space 510*a*.

Although not illustrated in FIG. 8, the first supply port 520 may be connected to a first supply line. The first supply line is a line for transferring the stripper 560 to the first supply port 520, and at least one valve may be installed on the first supply line to adjust a supply amount of the stripper 560.

The second supply port 530 provides a gas 570 to the internal space 510*a* of the body portion 510. The second supply port 530 may penetrate through the other surface of the body portion 510 to be connected to the internal space 510*a*. The second supply port 530 may provide, for example, compressed air to the internal space 510*a* of the body portion 510.

A length direction of the second supply port 530 may be perpendicular to a length direction of the first supply port 520. For example, when the first supply port 520 is formed to be elongated in the second direction 20, the second supply port 530 may be formed to be elongated in the third direction 30 to meet the first supply port 520 in the internal space 510*a* of the body portion 510.

Meanwhile, although not illustrated in FIG. 8, the second supply port 530 may be connected to a second supply line. The second supply line is a line for transferring the gas 570 (i.e., the compressed air) to the second supply port 530, and at least one valve may be installed on the second supply line to adjust a supply amount of the gas 570.

The spray port 540 sprays the stripper provided to the internal space 510*a* of the body portion 510 onto the substrate W. The stripper 560 flowing into the internal space 510*a* of the body portion 510 through the first supply port 520 may be misted by the gas 570 flowing into the internal space 510*a* of the body portion 510 through the second supply port 530. The stripper in a state of the mist 580 may be simultaneously sprayed onto the entire surface of the substrate W by the spray port 540.

A length direction of the spray port 540 may be perpendicular to the length direction of the first supply port 520, and may be parallel to the length direction of the second supply port 530. When the first supply port 520, the second supply port 530, and the spray port 540 are formed in such a structure, it is advantageous to mist the stripper 560 to simultaneously spray the misted stripper onto the entire surface of the substrate W.

The second nozzle 241*b* may spray the stripper on a solidified coating film 450, that is, a polymer coating film, in a state in which the particles 430*a* and 430*b* are collected, thereby peeling the coating film 450 from the substrate W. Here, the stripper may be de-ionized water (DIW).

Figure 9:
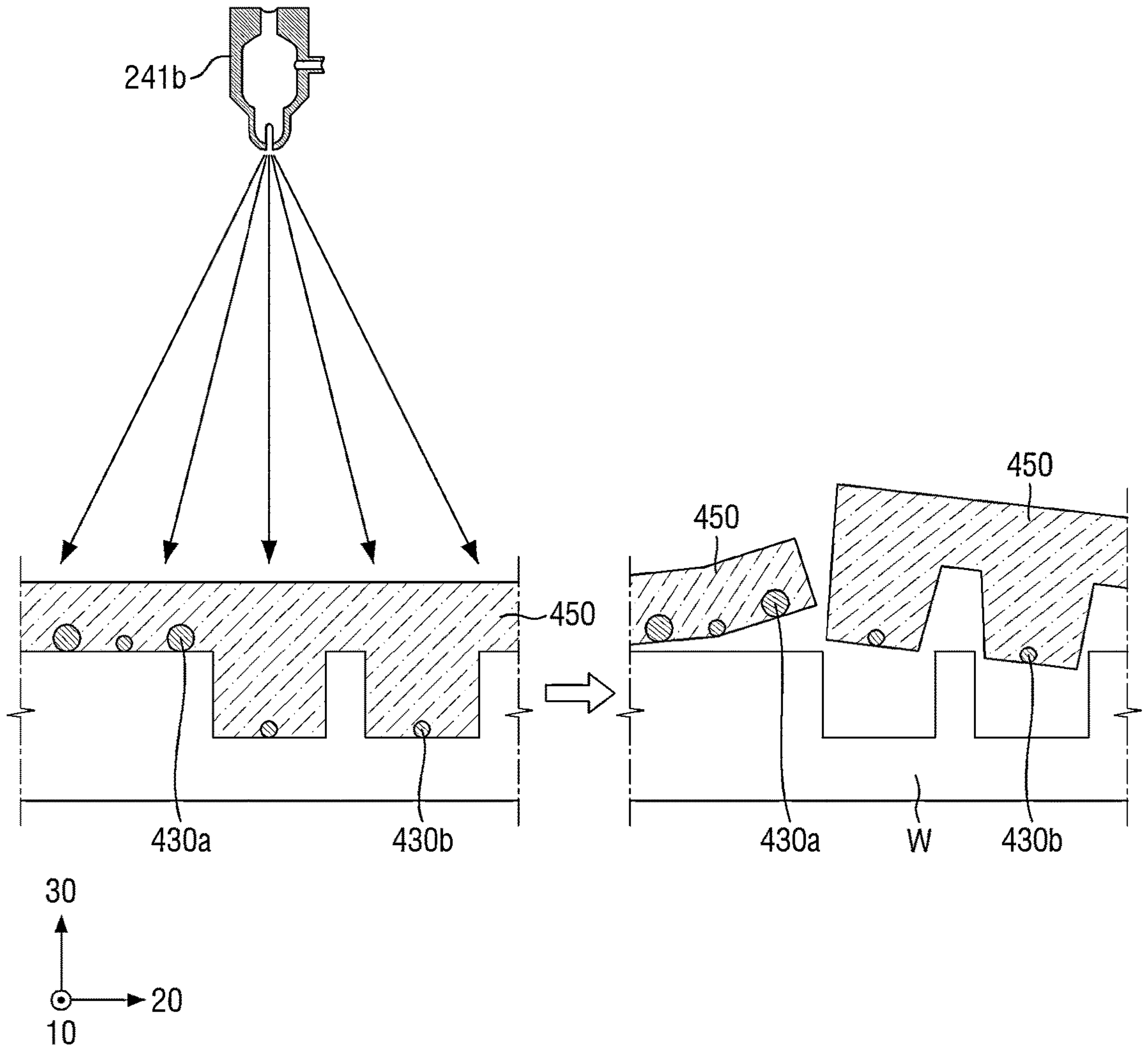
FIG. 9 is a third exemplary diagram for further describing each step of the substrate treatment method of FIG. 5.

The second nozzle 241*b* may be formed in the structure described above with reference to FIG. 8, and may peel the coating film 450 from the substrate W by spraying the stripper in an aerosol spray method, as illustrated in FIG. 9. FIG. 9 is a third exemplary diagram for further describing each step of the substrate treatment method of FIG. 5.

In the present exemplary embodiment, by simultaneously spraying the stripper on the entire surface of the substrate W through such a role of the second nozzle 241*b*, the entire surface of the substrate W may be uniformly wetted. Accordingly, it is possible to obtain an effect of improving wetting uniformity. In addition, the peeling of the coating film 450 may be facilitated due to a striking force of the stripper over the entire surface of the substrate W. In particular, it is possible to obtain an effect of facilitating even peeling of the coating film 450 across the entire surface of the substrate.

Figure 10:
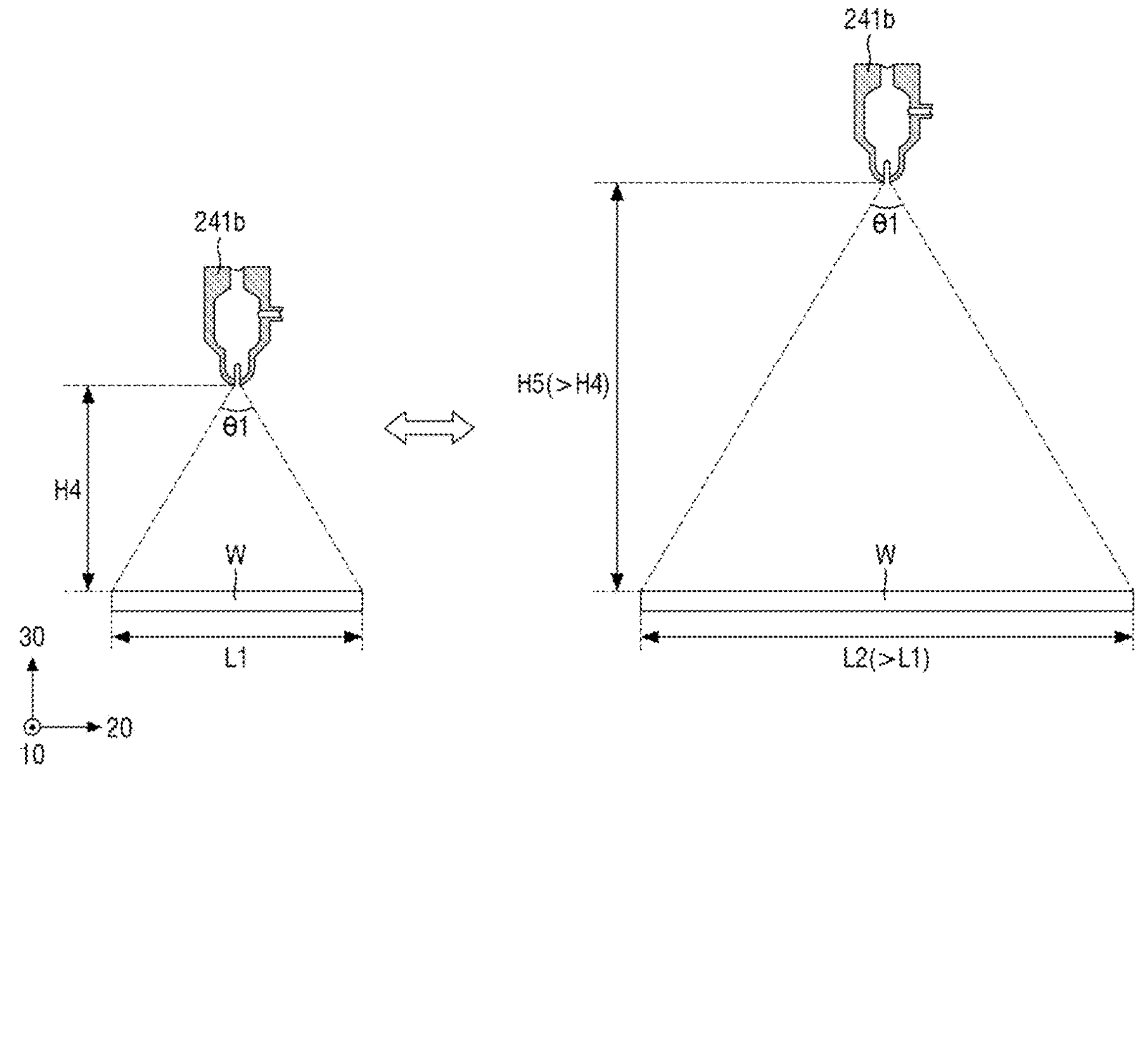
FIG. 10 is a first exemplary diagram for describing various performances of the second nozzle of the spray module constituting the substrate treatment apparatus according to an exemplary embodiment of the present disclosure.

In the present exemplary embodiment, in order for the stripper to be simultaneously sprayed on the entire surface of the substrate W, heights H4 and H5 of the second nozzle 241*b* from the substrate W may be adjusted according to sizes L1 and L2 of the substrate W as illustrated in FIG. 10. FIG. 10 is a first exemplary diagram for describing various performances of the second nozzle of the spray module constituting the substrate treatment apparatus according to an exemplary embodiment of the present disclosure.

Figure 11:
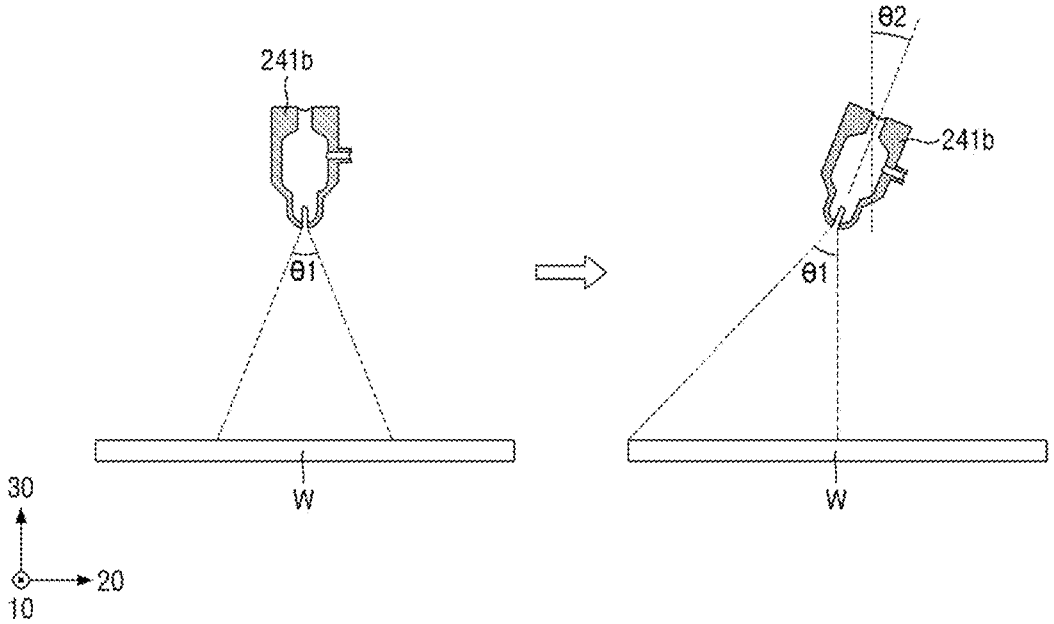
FIG. 11 is a second exemplary diagram for describing various performances of the second nozzle of the spray module constituting the substrate treatment apparatus according to an exemplary embodiment of the present disclosure.

Alternatively, as illustrated in FIG. 11, the stripper may be sprayed onto the substrate W while rotating the second nozzle 241*b*. In this case, the second nozzle 241*b* may be rotated in a state in which the second nozzle 241*b* is tilted by a predetermined angle $\theta_2$ in consideration of a sprayable range of the second nozzle 241*b*. FIG. 11 is a second exemplary diagram for describing various performances of the second nozzle of the spray module constituting the substrate treatment apparatus according to an exemplary embodiment of the present disclosure. Meanwhile, $\theta_1$ means the spray range of the spray port 540 in FIGS. 10 and 11.

The description will be provided again with reference to FIG. 5.

When the coating film 450 is peeled from the substrate W by the stripper (S340), a removal liquid is discharged on the substrate W using the third nozzle 241*c* of the spray module 240 (S350). Then, the coating film 450 remaining on the substrate W after being peeled from the substrate W, that is, a polymer residue may be rinsed from the substrate W by the removal liquid (S360).

The third nozzle 241*c* may discharge a rinse liquid including an organic solvent as a removal liquid onto the substrate W. The third nozzle 241*c* may discharge, for example, iso-propyl alcohol (IPA) onto the substrate W.

The semiconductor process system 100 including the substrate treatment apparatus 110 and the substrate treatment method of the substrate treatment apparatus 110 have been described above with reference to FIGS. 1 to 11.

The present disclosure relates to the method of peeling the polymer coating film using the de-ionized water (DIW) aerosol spray. According to the present disclosure, it is possible to improve the peeling performance of the polymer coating film by using the striking force of the DIW aerosol. In addition, according to the present disclosure, since the DIW aerosol is simultaneously sprayed onto the entire surface of the substrate, the DIW wetting uniformity on the substrate may be improved, and it is also possible to obtain an effect of facilitating uniform peeling of the entire surface of the substrate.

Although the exemplary embodiments of the present disclosure have been described with reference to the accompanying drawings, those of ordinary skill in the art to which the present disclosure pertains will understand that the present disclosure may be embodied in other specific forms without changing the technical concept or features thereof. Therefore, it should be understood that the exemplary embodiments described above are illustrative in all aspects and not restrictive.

What is claimed is:

1. A substrate treatment method comprising:

discharging a first liquid onto a substrate by using a first nozzle, and forming a coating film collecting particles by using the first liquid;

spraying a second liquid on the substrate by using a second nozzle, and peeling the coating film from the substrate by using the second liquid; and discharging a third liquid onto the substrate by using a third nozzle, and rinsing the coating film from the substrate by using the third liquid, wherein in the peeling of the coating film, the second liquid is sprayed on a surface of the substrate, and wherein, when positioned above the substrate to respectively discharge the first liquid, second liquid, and third liquid, the first nozzle used for forming the coating film and the third nozzle used for rinsing the coating film are positioned to be lower than the second nozzle used for peeling the coating film with respect to the substrate, wherein spraying the second liquid on the substrate using the second nozzle comprises:

rotating, while the second liquid is being discharged, the second nozzle used for peeling the coating film over a center of the substrate while a first terminal end of a nozzle supporting portion that holds the second nozzle over the center of the substrate is fixed in place over the center of the substrate, the second liquid covering an entirety of the surface of the substrate upon rotation of the second nozzle over the center of the substrate.

2. The substrate treatment method of claim 1, wherein in the peeling of the coating film, the second liquid is sprayed in the form of an aerosol.

3. The substrate treatment method of claim 1, wherein in the peeling of the coating film, the second liquid is sprayed using compressed air.

4. The substrate treatment method of claim 3, wherein the second liquid has a direction of movement changed by the compressed air.

5. The substrate treatment method of claim 1, wherein the second liquid is de-ionized water (DIW).

6. The substrate treatment method of claim 1, wherein the second nozzle sprays the second liquid onto the substrate while rotating.

7. The substrate treatment method of claim 6, wherein the second nozzle is tilted with respect to a direction perpendicular to a length direction of the substrate.

8. The substrate treatment method of claim 1, wherein the first liquid is a liquid in which a polymer and a volatile component are mixed.

9. The substrate treatment method of claim 1, wherein the third liquid includes iso-propyl alcohol (IPA).

10. The substrate treatment method of claim 1, further comprising separately recovering the first liquid, the second liquid, and the third liquid dispersed from the substrate into a first collection container, a second collection container, and a third collection container, respectively.

11. The substrate treatment method of claim 1, further comprising, after the forming of the coating film collecting the particles by using the first liquid and before the peeling of the coating film from the substrate by using the second liquid, heating the first liquid discharged on the substrate.

12. The substrate treatment method of claim 1, further comprising adjusting a height of at least one of a substrate support configured to support the substrate and a treatment liquid recovery structure configured to recover the first to third liquid with respect to one another.

13. The substrate treatment method of claim 1, wherein the first nozzle used for forming the coating film and the third nozzle used for rinsing the coating film are positioned at a same height as each other.

14. The substrate treatment method of claim 1, further comprising:

starting, before spraying the second liquid on the substrate and after the first liquid has naturally diffused and distributed over an entirety of the surface of the substrate, a rotation of the substrate.

15. A substrate treatment method comprising:

discharging a first liquid onto a substrate by using a first nozzle, and forming a coating film collecting particles by using the first liquid;

spraying a second liquid on the substrate by using a second nozzle, and peeling the coating film from the substrate by using the second liquid; and discharging a third liquid onto the substrate by using a third nozzle, and rinsing the coating film from the substrate by using the third liquid, wherein in the peeling of the coating film, the second liquid is sprayed on a surface of the substrate, wherein the substrate treatment method further comprises adjusting a height of the second nozzle used for peeling the coating film and configured to be height-adjustable according to a size of the substrate, and wherein, when positioned above the substrate to respectively discharge the first liquid, second liquid, and third liquid, the first nozzle used for forming the coating film and the third nozzle used for rinsing the coating film are positioned to be lower than the second nozzle used for peeling the coating film with respect to the substrate, wherein spraying the second liquid on the substrate using the second nozzle comprises:

rotating, while the second liquid is being discharged, the second nozzle used for peeling the coating film over a center of the substrate while a first terminal end of a nozzle supporting portion that holds the second nozzle over the center of the substrate is fixed in place over the center of the substrate, the second liquid covering an entirety of the surface of the substrate upon rotation of the second nozzle over the center of the substrate.

16. A substrate treatment method comprising:

discharging a first liquid onto a substrate using a first nozzle, and forming a coating film collecting particles by using the first liquid;

spraying a second liquid on the substrate by using a second nozzle, and peeling the coating film from the substrate by using the second liquid; and discharging a third liquid onto the substrate by using a third nozzle, and rinsing the coating film from the substrate by using the third liquid, wherein in the peeling of the coating film, a direction of movement of the second liquid is changed by using compressed air, and the second liquid is sprayed on a surface of the substrate in the form of an aerosol, and wherein, when positioned above the substrate to respectively discharge the first liquid, second liquid, and third liquid, the first nozzle used for forming the coating film and the third nozzle used for rinsing the coating film are positioned to be lower than the second nozzle used for peeling the coating film with respect to the substrate, wherein spraying the second liquid on the substrate using the second nozzle comprises:

rotating, while the second liquid is being discharged, the second nozzle used for peeling the coating film over a center of the substrate while a first terminal end of a nozzle supporting portion that holds the second nozzle over the center of the substrate is fixed in place over the center of the substrate, the second liquid covering an entirety of the surface of the substrate upon rotation of the second nozzle over the center of the substrate.

17. The substrate treatment method of claim 16, further comprising separately recovering the first liquid, the second liquid, and the third liquid dispersed from the substrate into a first collection container, a second collection container, and a third collection container, respectively.

18. The substrate treatment method of claim 16, further comprising, after the forming of the coating film collecting the particles by using the first liquid and before the peeling of the coating film from the substrate by using the second liquid, heating the first liquid discharged on the substrate.

19. The substrate treatment method of claim 16, further comprising adjusting a height of at least one of a substrate support configured to support the substrate and a treatment liquid recovery structure configured to recover the first to third liquid with respect to one another.

* * * * *